United States Patent
Filippi, Jr. et al.

(10) Patent No.: US 7,260,810 B2
(45) Date of Patent: Aug. 21, 2007

(54) METHOD OF EXTRACTING PROPERTIES OF BACK END OF LINE (BEOL) CHIP ARCHITECTURE

(75) Inventors: Ronald G. Filippi, Jr., Wappingers Falls, NY (US); Giovanni Fiorenza, Pomona, NY (US); Xiao Hu Liu, Croton-on-Hudson, NY (US); Conal Eugene Murray, Yorktown Heights, NY (US); Gregory Allen Northrop, Putnam Valley, NY (US); Thomas M. Shaw, Peekskill, NY (US); Richard Andre' Wachnik, Mount Kisco, NY (US); Mary Yvonne Lanzerotti Wisniewski, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 10/687,475

(22) Filed: Oct. 16, 2003

(65) Prior Publication Data
US 2005/0086628 A1 Apr. 21, 2005

(51) Int. Cl.
*G06F 17/50* (2006.01)
*G03F 1/00* (2006.01)
(52) U.S. Cl. ............... 716/20; 716/1; 716/3; 430/5
(58) Field of Classification Search ............... 716/1, 716/4–7, 17, 19–21; 702/65; 703/13, 14; 382/154; 430/5
See application file for complete search history.

(56) References Cited
U.S. PATENT DOCUMENTS

| | | | |
|---|---|---|---|
| 5,172,420 A * | 12/1992 | Ray et al. .............. 382/150 |
| 6,072,608 A * | 6/2000 | Psaltis et al. ............ 359/22 |
| 6,353,801 B1 * | 3/2002 | Sercu et al. ............ 702/65 |
| 6,367,053 B1 * | 4/2002 | Belk et al. .............. 716/2 |
| 6,601,025 B1 * | 7/2003 | Ditlow et al. ............ 703/14 |
| 6,629,292 B1 * | 9/2003 | Corson et al. ............ 716/3 |
| 6,681,376 B1 * | 1/2004 | Balasinski et al. ........ 716/4 |
| 6,766,261 B2 * | 7/2004 | Nishino et al. .......... 702/65 |
| 6,907,583 B2 * | 6/2005 | Abt et al. .............. 716/1 |
| 2003/0103150 A1 * | 6/2003 | Catrysse et al. ......... 348/272 |
| 2005/0066301 A1 * | 3/2005 | Lorenz et al. ........... 716/20 |
| 2006/0094046 A1 * | 5/2006 | Abo et al. .............. 435/6 |

OTHER PUBLICATIONS

Brankovic et al., "An improved FD-TD full wave analysis for arbitrary guiding structures using a two-dimensional mesh", Jun. 5, 1992, Microwave Symposium Digest, 1992., IEEE MTT-S International, pp. 389-392 vol. 1 ☐☐.*

Bagnoli et al., Fast analytical thermal modeling of electronic devices and circuits with multi-layer stack mountings, Dec. 10-12, 2003, Electronics Packaging Technology, 2003 5th Conference (EPTC 2003), pp. 501-506.*

* cited by examiner

*Primary Examiner*—Stacy A. Whitmore
*Assistant Examiner*—Helen Rossoshek
(74) *Attorney, Agent, or Firm*—Keusey, Tutunjian & Bitetto, P.C.; Robert M. Trepp, Esq.

(57) ABSTRACT

A method for analyzing circuit designs includes discretizing a design representation into pixel elements representative of a structure in the design and determining at least one property for each pixel element representing a portion of the design. Then, a response of the design is determined due to local properties across the design.

32 Claims, 5 Drawing Sheets

METHOD OF EXTRACTING PROPERTIES OF BACK END OF LINE (BEOL) CHIP ARCHITECTURE

BACKGROUND OF THE INVENTION

1. Field of the Invention

The present invention relates generally to methods and systems for analyzing circuit architectures, and more particularly, to methods and systems, which determine properties in multilevel interconnection wiring designs for semiconductor devices.

2. Description of the Related Art

To meet demand for increased device density and performance, semiconductor technology which includes a low dielectric constant material (low-k) and interconnection wiring of copper metallurgy is preferable. Such techniques lend themselves to a double or dual damascene method of processing. Because, dry air has the theoretically lowest dielectric constant of one (1), most low-k materials such as, aerogels, hydrogen silsesquioxane (HSQ), oxides (such as, fluorinated oxides), organic polymers (e.g., polyareolyene ether organic dielectrics, such as SiLK™, available from Dow chemical Co., Midland, Mich.), organosilicate glass (e.g., SiCOH deposited by CVD) or porous forms of these compounds are employed.

The high performance interconnection is formed with wirings of high conductivity metallurgies on different levels, insulated from each other with layers of low-k dielectric, and interconnected at desired points. To prevent, or to reduce, the corrosive impurity ingression into the interconnection wiring structure, at least one layer of the top most layer of interconnection wiring is embedded in one or more layers of prior formed standard insulators such as silicon oxide deposited by, e.g., the plasma enhanced chemical vapor deposition (PECVD) using silane ($SiH_4$) or tetraethylorthosilicate (TEOS) precursors. Accordingly, high performance interconnection is comprised of one or more layers of high conductivity copper interconnections, embedded in the low-k dielectric, such as SiLK, and bounded on top and bottom by much denser layers of plasma etched chemical vapor deposited (PECVD) oxide and boro-phosphosilicate glass (BPSG), respectively.

Because of the growing complexity of microcircuitry within existing and future generations of microprocessors, the ability to predict the behavior of circuitry composed of these materials under operational conditions has become more difficult. Techniques that rely on modeling the response of the chip architecture using existing methods are often limited to small sections of the entire chip due to the large number of individual interconnect structures that must be considered.

The determination of the mechanical response of the three-dimensional back end of line (BEOL) architecture on a local scale is difficult using existing tools based on finite element modeling. However, these methods become intractable for the determination of the behavior of the microcircuitry design across the entire chip.

SUMMARY OF THE INVENTION

A method for analyzing circuit designs includes discretizing a design representation into pixel elements representative of a structure in the design and determining at least one property for each pixel element representing a portion of the design. Then, a response of the design is determined due to local properties across the design.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention provides systems and methods for extracting the properties of a multilevel interconnect structure from graphical depictions of the designs. The present invention may be useful in designs, which include, for example, low-k dielectric back end of line (BEOL) architecture for an entire chip; however, any semiconductor or circuit technology may benefit. The present invention provides methods for determining the properties of a multilevel interconnect design prior to its manufacture so that the effects of design alterations can be evaluated, and cost savings realized prior to committing to the full-blown manufacture of the design or even before assembling a prototype or model.

Figure 1:
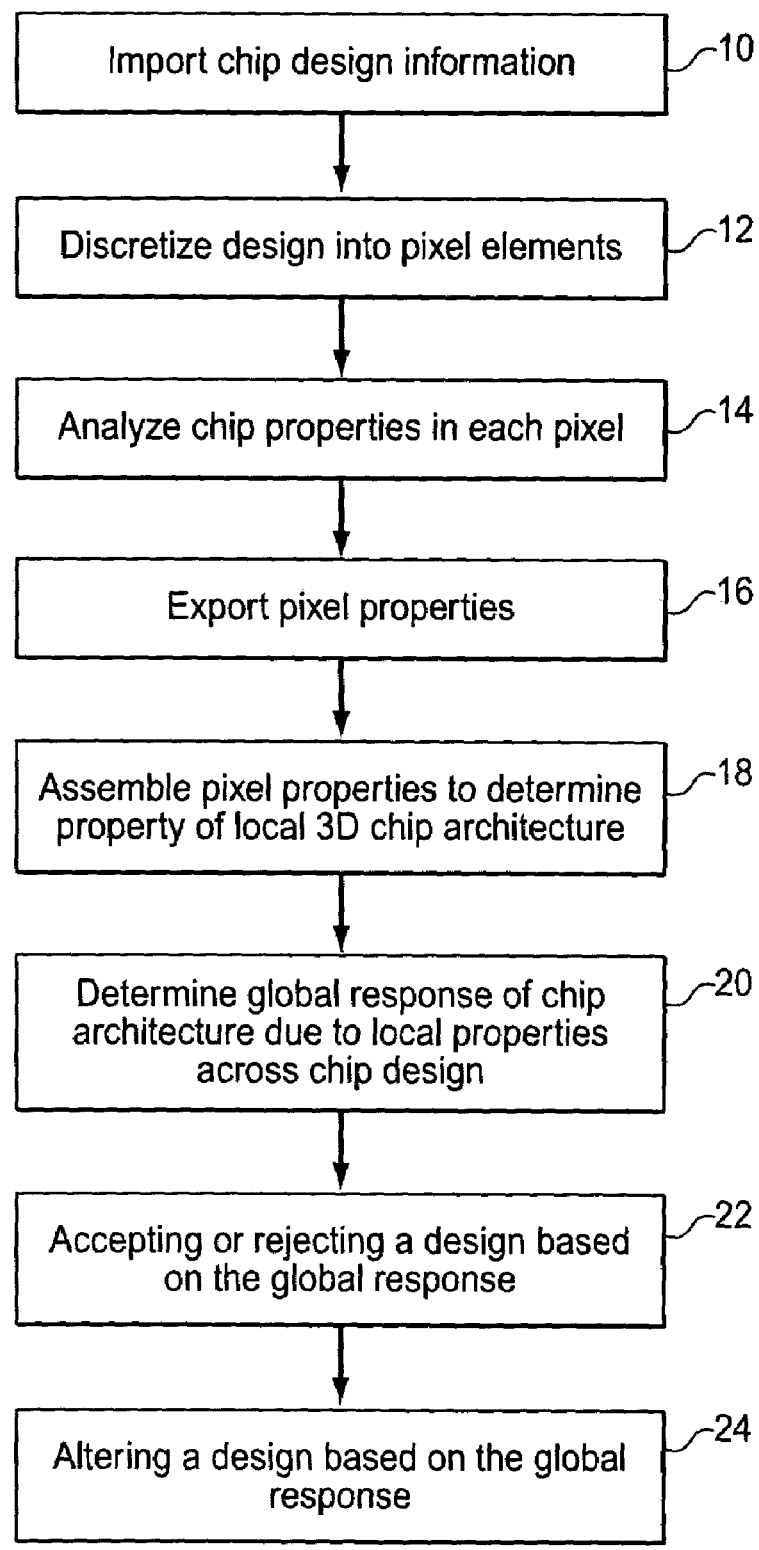
FIG. 1 is a block/flow diagram describing a system and method for an illustrative embodiment for extracting properties and chip/circuit design information.

It should be understood that the elements shown in FIG. 1 may be implemented in various forms of hardware, software or combinations thereof. Preferably, these elements are implemented in software on one or more appropriately programmed general-purpose digital computers having a processor and memory and input/output interfaces. Referring now to the drawings in which like numerals represent the same or similar elements and initially to FIG. 1, a block/flow diagram illustratively depicts steps for analyzing an individual chip, a chip design or circuit design in one preferred embodiment of the present invention. In block 10, design files of the chip circuitry, which are included, for example, in GDS™ formatted files (GDS™ is a file format of Cadence Design Systems, Inc., San Jose, Calif.), and are imported to a system, such as a computer system or computing device. Files of other formats and representations may also be provided. For example, scanned in files from actual drawings may be input to a system of the present invention, or detailed photographs or digital images may be employed. Such images will include three-dimensional spatial information or other information as needed.

In block 12, the imported files are discretized into a rectangular mesh of pixel elements. This may be performed in a plurality of ways. For example, each pixel element preferably represents a subsection of the chip design. The area of each pixel can be uniform or can be adaptively sized to match features within the chip design.

Figure 2:
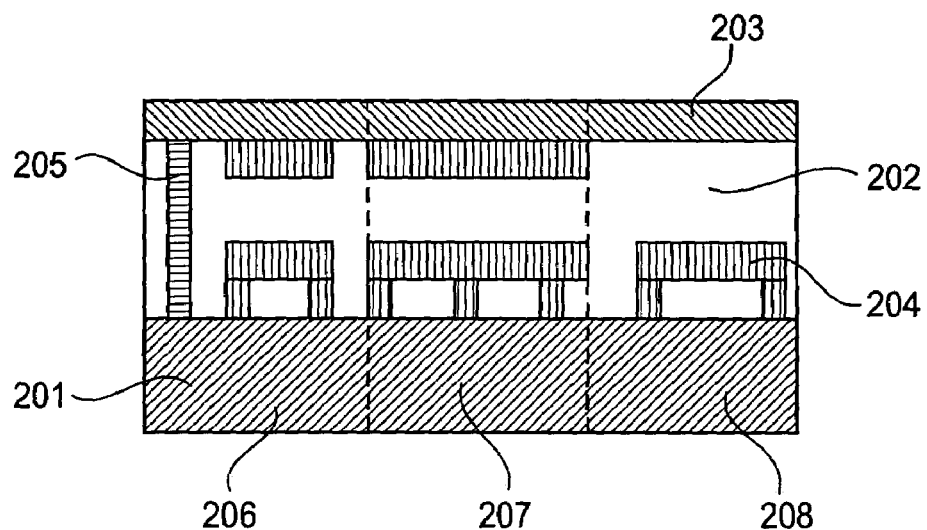
FIG. 2 is an illustrative cross-sectional view of a discretized back end of line (BEOL) architecture.

The information of the chip design is imported into the software that analyzes the chip properties (block 10), and the design is discretized into many individual pixels, each of which corresponds to a certain portion of the chip area. Referring to FIG. 2, a discretization of a small portion of a chip design, including a semiconductor substrate 201, a back end of the line (BEOL) dielectric material 202, a top passivation layer 203 and the BEOL interconnect metallization 204 are shown. The structure of FIG. 2 shown as a cross-sectional view is converted into three pixels 206, 207 and 208. The conversion is based upon the density of metal or the geometric features present in the portion of the design. Each pixel (206, 207 and 208) is based on a given geometric feature (e.g., area, length, etc.).

Referring again to FIG. 1, in block 14, the design information within each pixel is then analyzed at each level of the design for a specific property. For example, a ten layered printed wiring board circuit or a chip may be analyzed at each layer for a property, say metallization percent. Then, small three-dimensional portions of the design may be represented in two dimensions, for example, by a gray-scale or colored image. Other representations, such as symbols are also contemplated. The ten layers may be folded down into a single layer, which indicates the properties of the design for the particular parameter(s) analyzed (in e.g., block 20). These properties may include, e.g., thermal conductivity, light reflectance, mechanical stiffness, etc. The analysis may be in conjunction with software code written to analyze geometric information in design files (e.g., GDS™ files. In one example, NIAGARA™ code (NIAGARA™ is a trademark of IBM®) is employed to analyze geometric information in design files. This will be described in greater detail hereinbelow.

Figure 3:
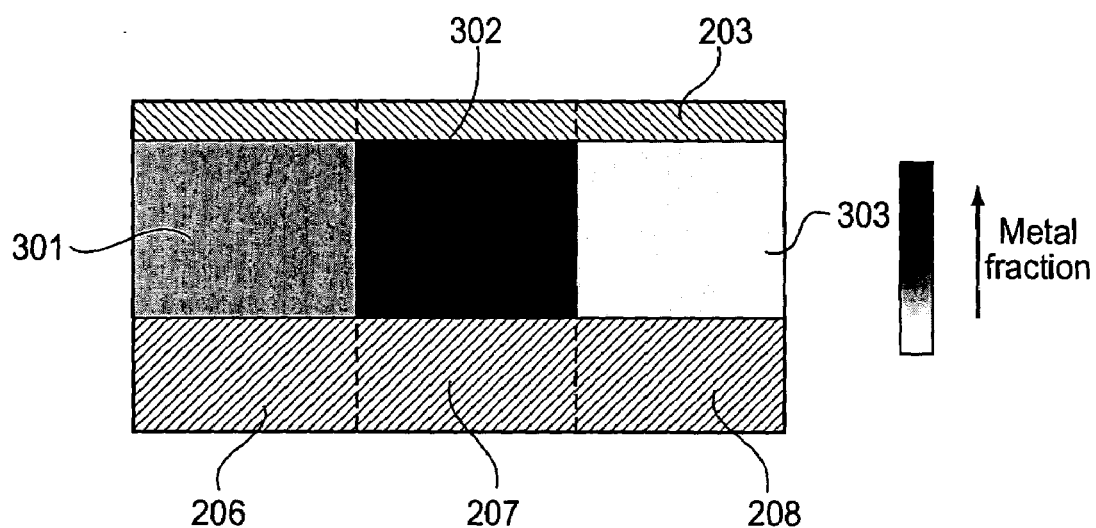
FIG. 3 is an illustrative representation of metal fraction from the discretized BEOL architecture shown in FIG. 2.

In one embodiment, for each pixel, the volume fraction of interconnect metallization 204 to dielectric material 202 (see FIG. 2) is calculated and represented as areas 301, 302 and 303 as shown in FIG. 3.

Referring to FIG. 3 with continued reference to FIG. 2, the volume fraction of the metallization, or metal fraction, is represented by the three areas 301, 302, and 303, in which the second pixel 207 includes the most metallization (302) and the third pixel 208 includes the least metallization (303). In addition, a software search routine, known in the art, is executed to locate and count the number of stacked via structures 205 (FIG. 2) or other designated structure or properties. Stacked via structures 205 in this case are defined as BEOL metallization that runs vertically from the substrate 201 to the top passivation level 203, which may be present in pixels. In this example, only one stacked via structure 205 is present in the first pixel 206.

Referring again to FIG. 1, in block 16, a table of values of the specific property is exported for each design level. The information calculated in block 14 is preferably exported to a software application or program that performs the subsequent steps of determining the global response of the entire chip to a particular driving force. This may be performed by integrating the data from all the layers and providing a single map or footprint in block 20.

In one embodiment, the global response is the thermal strain that develops in the BEOL levels during thermal cycling due to the thermal expansion mismatch between the dielectric material and interconnect metallization. This strain is developed within a layer and in between layers, such that structures within the volume represented by each pixel have an effect on surrounding areas next to, above and below. This information is advantageously accumulated and demonstrated in a single color or gray-scale setting for the volume represented by that pixel.

In the case of an organic dielectric material with a high thermal expansion coefficient, the stacked via structures 205 (FIG. 2) pin down the top passivation layer 203 (FIG. 2) which can lead to high levels of strain in the stacked vias.

The information within each pixel is then assembled among all of the design levels to determine the effective property of the three-dimensional volume represented by the pixels in block 18. The method of assembly depends on the property under investigation. For example, the relative fraction of metallization within a pixel is determined by averaging the values of metal fraction among all of the design levels that were analyzed.

Figure 4:
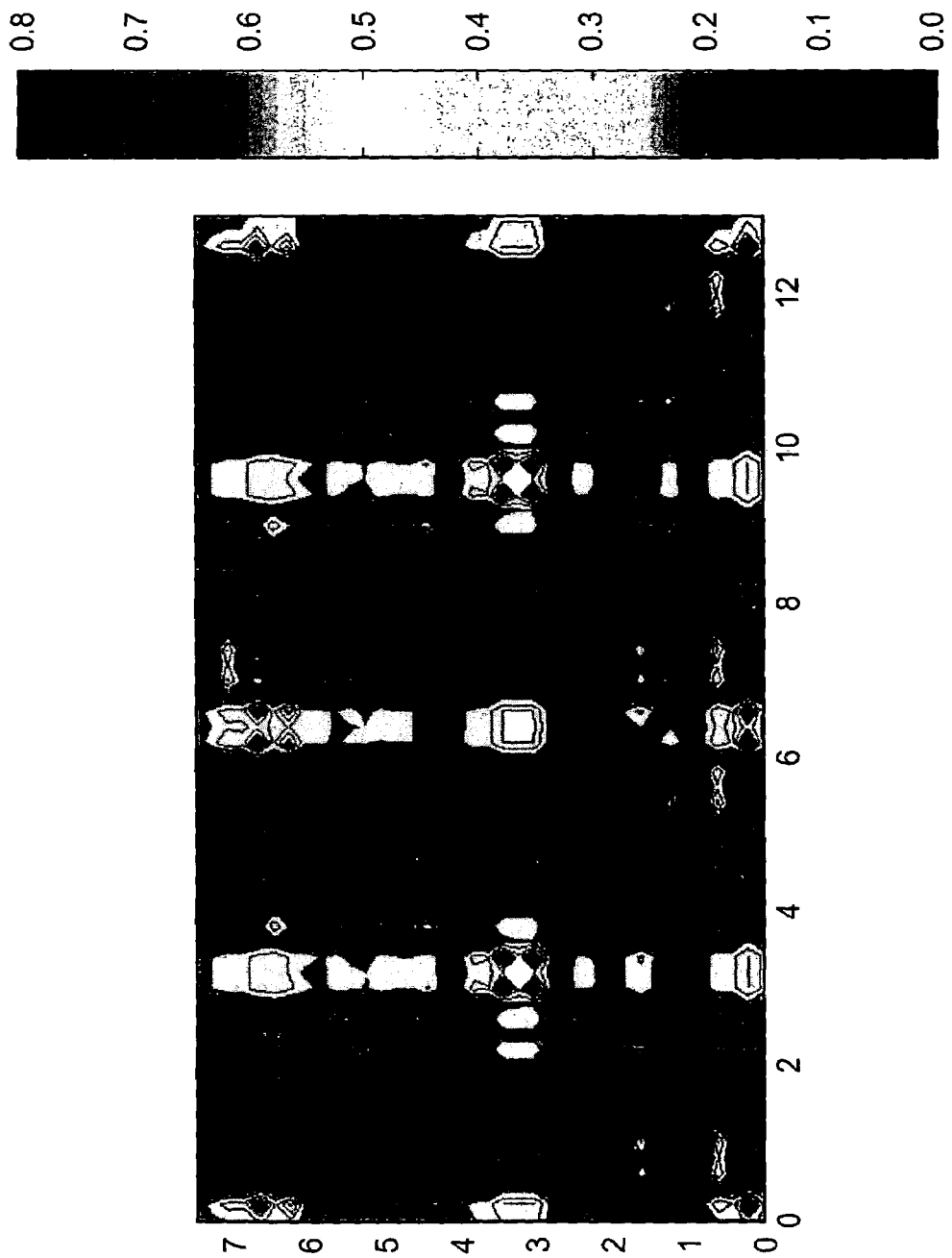
FIG. 4 is an illustrative representation of the metal fraction for an entire chip design.

The information gathered in block 14 is assembled to produce a map of the metal fraction of the entire chip. FIG. 4 depicts the metal fraction information for a general chip design, which runs from approximately 0.1 or 10% to approximately 0.8 or 80%. Information on the position of stacked via structures is also assembled so that a map of all stacked via locations on the chip is generated (not shown).

The resulting information represents input for block 20 (FIG. 1), which involves determining the behavior of the entire chip from its constitutive pixel elements. The method of determining the chip behavior depends on the specific property as well as the extent of interaction between adjacent pixels. For example, the response of the interconnect structures within the BEOL architecture to thermal cycling is determined by the vertical displacement field of the top oxide passivation levels which need information from all of the pixels included within an outer guard ring.

Figure 5:
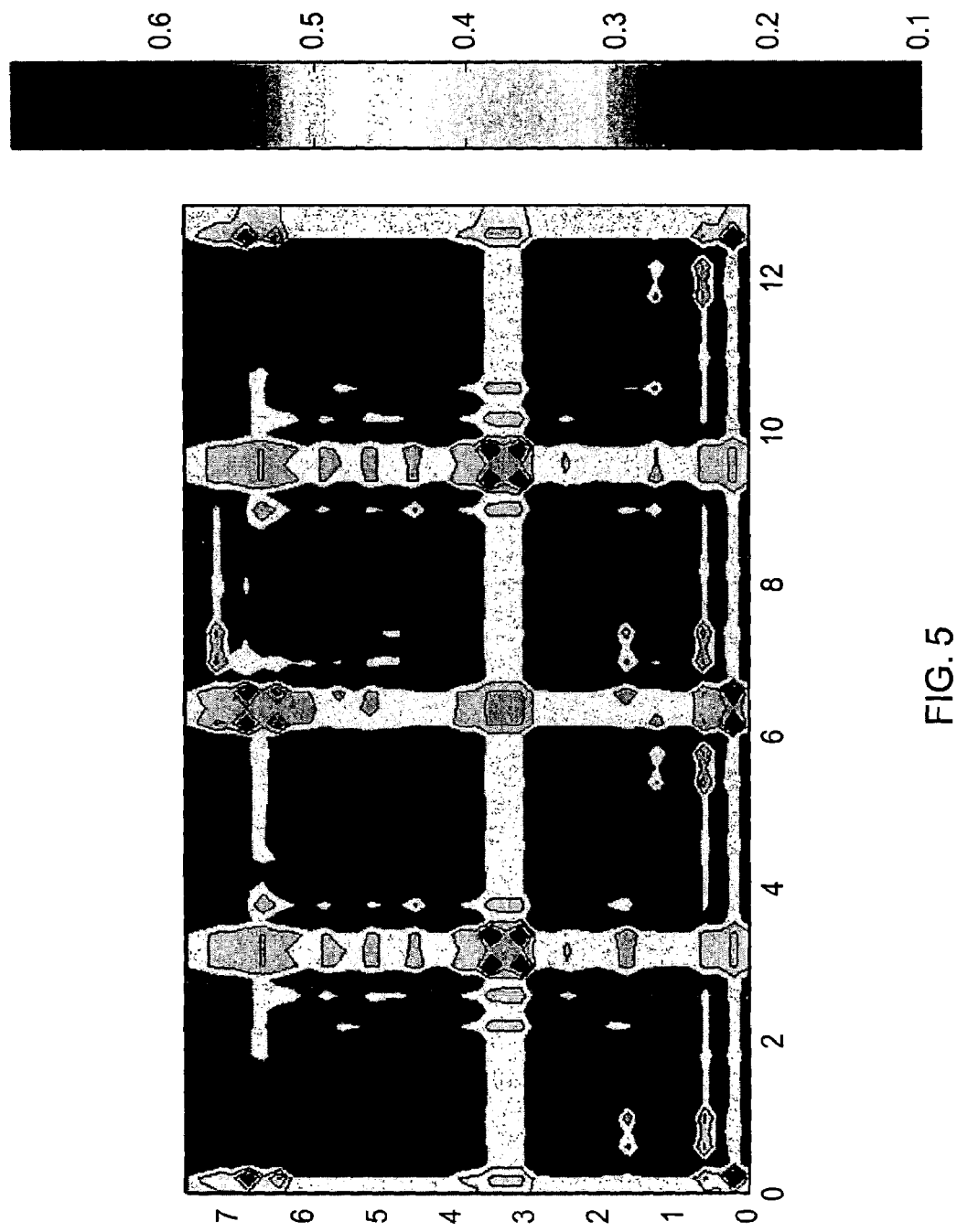
FIG. 5 is a map of calculated thermal strain in the chip design of FIG. 4.

In a preferred embodiment, the thermal strain in the BEOL levels is calculated by determining the deflection of the top passivation level 203 (FIG. 2) during thermal cycling using, for example, a finite element method-based solver. The deflection across the entire chip design is then mapped as shown, e.g. in FIG. 5, for the chip design of FIG. 4.

The scale of the deflection is normalized so that the case of pure organic dielectric material in the BEOL levels would have a value of 1.0 or 100% deflection. The deflection in FIG. 5 spans a range from approximately 0.2 or 20% to 0.65 or 65%. The strain in each of the stacked vias in the design, identified in block 14, is determined by dividing the calculated deflection by the length of the stacked via structure 205.

Turning again to FIG. 1, in block 22, after determining a response for a given design, the design is checked against predetermined criteria. This may be done automatically or by manual inspection. The user or system then accepts or rejects a design based on the response. This process may be iterative to converge on an acceptable design by altering a design based on the response in block 24.

Figure 6:
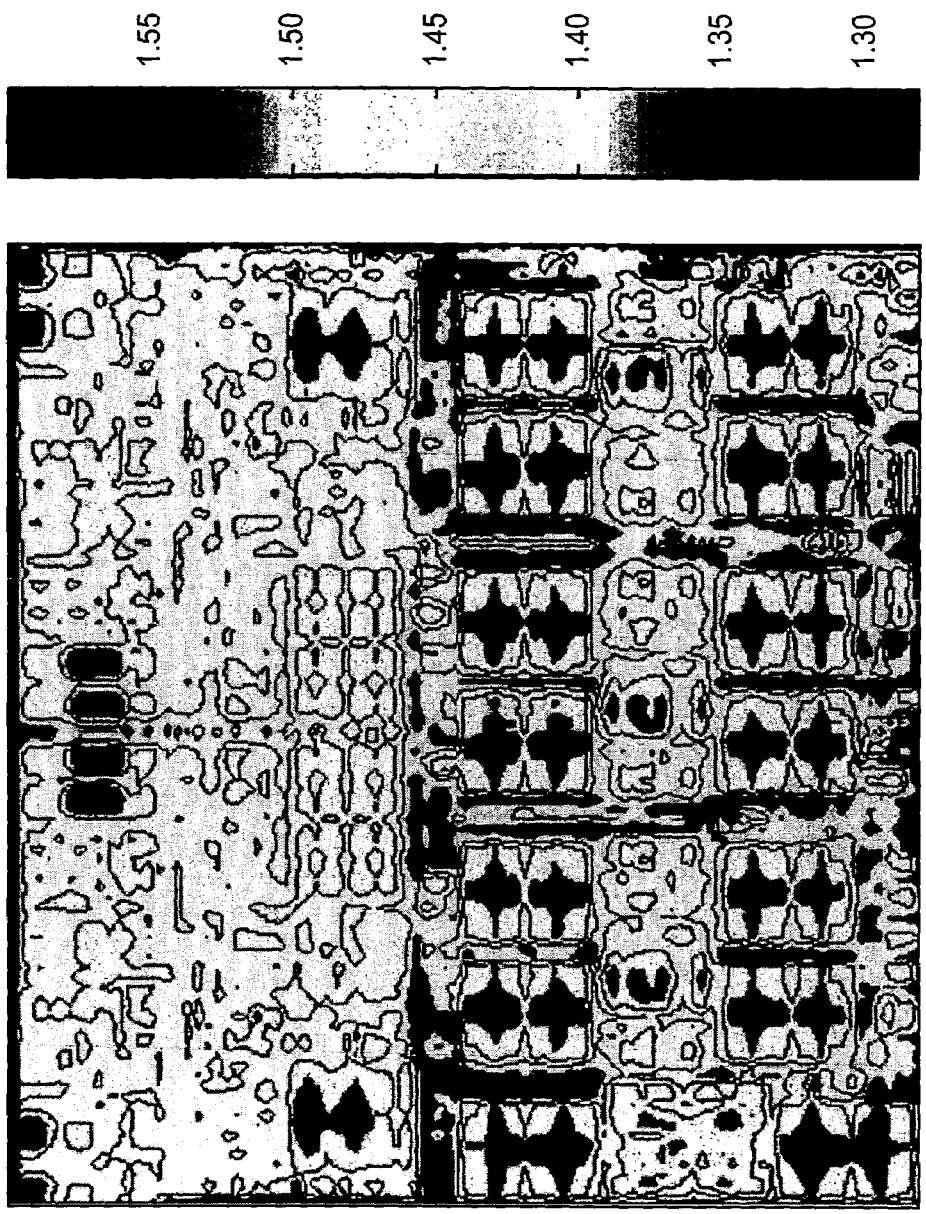
FIG. 6 is a depiction of the change in mechanical response, or stiffness, across an entire hypothetical chip design.

The present invention has been applied to extracting BEOL properties from the chip design information for CMOS designs. However, the method is extendable to all generations of microprocessor (logic and memory) design. FIG. 6 includes the results of an evaluation of the mechanical response or stiffness, in units of GPa/micron, across an entire hypothetical CMOS design. Other global responses may include temperature profiles, strain, stiffness, light reflectance or absorption, etc.

In an alternate embodiment, the present method can be applied to future chip designs, such as future CMOS designs, to evaluate the expected behavior of the entire chip. Alterations in the chip design can be implemented and their effect on the response of the chip can be reevaluated.

It should be apparent to those skilled in the art that given the teachings herein may be applied to other designs and may be made without departing from the spirit of the present invention. The BEOL architecture to be analyzed is not limited to copper metallurgy in low k dielectric material but can be applied to any type of material system or for any properties in a system, for example, cavities of spaces in a design. For example, different dielectrics may be compared in fractional relationships, electrical characteristics may be mapped, or temperature characteristics determined. The response of the chip design under investigation is not limited to mechanical behavior but can also represent other features or properties such as e.g., the thermal characteristics across a chip design. Another example may include dielectric geometry, such as air-gaps, air-bridges or cavity density, which may be included in a design. These features may be evaluated in accordance with the present invention as well. Accordingly, such modifications are considered within the scope of the invention as limited solely by the appended claims.

Having described preferred embodiments of a system and method for extracting properties of back end of line (BEOL) chip architecture(which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for analyzing circuit designs, comprising the steps of:
    discretizing a design representation into displayable pixel elements representative of a structure in the design where each pixel element represents a portion of the design where the portion represents a geometric feature;
    determining at least one property for each pixel element representing the portion of the design where the at least one property is represented by an intensity of the pixel element, such that the pixel elements provide a pixel map to visually represent the design representation based on the at least one property; and
    determining a response of the design due to local properties across the design based upon representations of the pixel elements.

2. The method as recited in claim 1, further comprising the step of exporting pixel properties to an application.

3. The method as recited in claim 1, further comprising the step of assembling pixel properties to determine local three-dimensional properties.

4. The method as recited in claim 3, wherein the step of determining a response of the design due to local properties across the design includes the step of determining a global response for an architecture due to the local three-dimensional properties.

5. The method as recited in claim 1, further comprising the step of importing a design to be analyzed.

6. The method as recited in claim 5, wherein the design includes a computer generated design of one of a circuit and a chip.

7. The method as recited in claim 1, wherein the at least one property includes metal fraction and the global response includes thermal strain.

8. The method as recited in claim 1, wherein the step of determining a response of the design includes accepting or rejecting a design based on the response.

9. The method as recited in claim 8, further comprising the step of altering a design based on the response.

10. The method as recited in claim 1, wherein the step of determining a response further includes representing a three-dimensional multi-layered design in two dimensions such that properties within all layers are accumulated and represented in the two-dimensional image.

11. A program storage device readable by machine, tangibly embodying a program of instructions which when executed by the machine performs method steps for analyzing circuit designs, as recited in claim 1.

12. The method as recited in claim 1, wherein the at least one property includes metal fraction information relating to the metal fraction of stacked via structures.

13. A method for analyzing circuit designs, comprising the steps of:
    discretizing a design representation into displayable pixel elements representative of a structure in the design where each pixel element represents a portion of the design where the portion represents a geometric feature;
    analyzing properties in each pixel element to represent the properties by an intensity of the pixel element, such that the pixel elements provide a pixel map to visually represent the design representation based on the properties;
    assembling pixel properties to determine properties of a local three-dimensional circuit architecture; and
    determining a global response of the circuit architecture due to local properties across the design based upon representations of the pixel elements.

14. The method as recited in claim 13, further comprising the step of exporting pixel properties to an application.

15. The method as recited in claim 13, further comprising the step of importing a design to be analyzed.

16. The method as recited in claim 15, wherein the design includes a computer generated design of one of a circuit and a chip.

17. The method as recited in claim 13, wherein the properties include metal fraction and the global response includes thermal strain.

18. The method as recited in claim 13, wherein the step of determining a global response of the design includes accepting or rejecting a design based on the global response.

19. The method as recited in claim 18, further comprising the step of altering a design based on the global response.

20. The method as recited in claim 13, wherein the step of determining a response further includes representing a three-dimensional multi-layered design in two dimensions such that properties within all layers are accumulated and represented in the two-dimensional image.

21. A program storage device readable by machine, tangibly embodying a program of which when executed by the machine performs method steps for analyzing circuit designs, as recited in claim 13.

22. The method as recited in claim 13, wherein the properties in each pixel element include metal fraction information relating to the metal fraction of stacked via structures.

23. A method for analyzing circuit designs, comprising the steps of:

importing a digitally rendered representation of a design;

discretizing the design representation into displayable pixel elements representative of a structure in the design where each pixel element represents a portion of the design where the portion represents a geometric feature;

analyzing properties in each pixel element by calculating the properties based on geometrical features in the design where the properties are represented by an intensity of the pixel element, such that the pixel elements provide a pixel map to visually represent the design representation based on the at least one property;

assembling pixel properties in geometrical regions to determine properties of a local three-dimensional circuit architecture; and determining a global response of the circuit architecture due to the local properties across the design based upon representations of the pixel elements.

24. The method as recited in claim 23, further comprising the step of exporting pixel properties to an application.

25. The method as recited in claim 23, wherein the design includes the design of a circuit or a chip.

26. The method as recited in claim 23, wherein the properties include metal fraction and the global response includes thermal strain.

27. The method as recited in claim 23, wherein the step of determining a global response of the design includes accepting or rejecting a design based on the global response.

28. The method as recited in claim 23, further comprising the step of altering a design based on the global response.

29. The method as recited in claim 23, wherein the step of determining a response further includes representing a three-dimensional multi-layered design in two dimensions such that properties within all layers are accumulated and represented in the two-dimensional image.

30. A program storage device readable by machine, tangibly embodying a program of instructions which when executed by the machine performs method steps for analyzing circuit designs, as recited in claim 23.

31. The method as recited in claim 23, wherein the properties include metal fraction information relating to metal fraction generated for the location and number of stacked via structures.

32. A method for analyzing circuit designs, comprising the steps of:

discretizing a design representation into displayable pixel elements representative of a structure in the design where each pixel element represents a portion of the design where the portion represents a geometric feature;

determining at least one property for each pixel element representing a portion of the design wherein the at least one property includes metal fraction information relating to a metal fraction of structures in the portion, such that the pixel elements provide a pixel map to visually represent the design representation based on the metal fraction information; and determining a response of the design due to local properties across the design.

* * * * *